United States Patent [19]
Gross et al.

[11] Patent Number: 5,606,793
[45] Date of Patent: Mar. 4, 1997

[54] MULTIPLE COMPONENT ASSEMBLY ALIGNMENT TOOL

[75] Inventors: Steven K. Gross, Midland; Wesley S. Hailes, Gardendale, both of Tex.

[73] Assignee: Texas Instruments Incorporated, Dallas, Tex.

[21] Appl. No.: 629,915

[22] Filed: Apr. 10, 1996

Related U.S. Application Data

[63] Continuation of Ser. No. 375,075, Jan. 17, 1995, abandoned, which is a continuation of Ser. No. 66,810, May 24, 1993, abandoned.

[51] Int. Cl.$^6$ .............................. B23P 19/04; H05K 13/04
[52] U.S. Cl. .............................................. 29/760; 269/903
[58] Field of Search ........................... 29/759, 760, 827; 174/52.4; 269/903; 439/331

[56] References Cited

U.S. PATENT DOCUMENTS

| | | | |
|---|---|---|---|
| 4,007,479 | 2/1977 | Kowalski | 29/760 X |
| 4,767,984 | 8/1988 | Bakker | 439/331 X |
| 5,014,418 | 5/1991 | Wright | 29/827 |
| 5,085,362 | 2/1992 | Art et al. | 29/760 X |

*Primary Examiner*—Peter Vo
*Attorney, Agent, or Firm*—Paul C. Hashim; Jim Brady; Richard Donaldson

[57] ABSTRACT

A lid alignment assembly for components such as semiconductor device packages, includes a boat 40 for holding at least one semiconductor package 36 and an alignment cover 10 mountable to the boat 40 and having at least one opening 11a therein for positioning a lid 11 over the semiconductor package 36 received in the boat 40. A plurality of tapered tabs 12–19 extend from the cover 10 and contact one or both of the boat 40 and semiconductor package 36 to direct the semiconductor package 36 to a predetermined position beneath the cover 10 and said at least one cover opening 11a.

10 Claims, 3 Drawing Sheets

MULTIPLE COMPONENT ASSEMBLY ALIGNMENT TOOL

This application is a continuation, of application Ser. No. 08/375,075, filed Jan. 17, 1995 now abandoned, which application is a continuation, of application Ser. No. 08/066,810, filed May 24, 1993 now abandoned.

FIELD OF THE INVENTION

This invention relates to semiconductor devices, and more particularly to an alignment tool for alignment of integrated circuit package lids for the package.

BACKGROUND OF THE INVENTION

As the degree of integration of semiconductor integrated circuits increases, greater demands are placed on integrated circuit packaging and assembly. Common among these demands is a need for miniaturization of integrated circuit packages. This miniaturization forces critical consideration of package design criteria. For hermetic packaging, package and lid dimensions are squeezed from both sides, i.e. higher levels of integration resulting in larger semiconductor die sizes which must be accommodated by the package cavity, while integrated circuit users demand the greatest possible density of circuit functions per square inch of circuit board space, driving external package dimensions smaller. Given these demanding package design considerations, lid-to-package alignment accuracy plays a key role in package integrity.

Common techniques for locating integrated circuit package elements during encapsulation consist of two pieces of tooling: a boat that carries and locates the package or substrate, and an alignment cover that locates the other package element or lid during thermal processing, including encapsulation. This technique introduces several sources of variation in package/lid alignment, such as variation in package or substrate dimension which must be accommodated by the boat. This necessary clearance reduces the locational accuracy of the lid relative to the package. Similarly, the alignment cover's positional accuracy is determined by the clearance between its cavity dimension and the lid being located. Also, the relative position of the cover's cavity or lid alignment features to those alignment features of the boat affect package die alignment.

SUMMARY OF THE INVENTION

The invention is an integrated circuit package lid alignment tool that minimizes variance of the lid-to-package alignment. An alignment boat has a recessed area in which the package is placed. An alignment cover is positioned over the boat and positioned by alignment tabs that are inserted into openings in the boat, and prevent the alignment cover from moving. Lid tabs on the alignment cover have a chamfer or beveled shape locating the semiconductor package beneath the cover. The lid is placed over the package through an opening in the alignment cover that has been accurately located over the semiconductor package by the alignment tabs.

The lid alignment assembly includes a boat for holding at least one semiconductor package, an alignment cover, mountable to said boat and having at least one opening therein for positioning a lid over the semiconductor package in said boat, and a plurality of tapered tabs extending from said cover, in contact with said semiconductor package, for centering said semiconductor package under said at least one opening in said cover.

The objects of the present invention will become apparent from the following description of a preferred embodiment of the invention when considered in conjunction with the accompanying drawings and the novel features set forth in the appended claims.

DESCRIPTION OF A PREFERRED EMBODIMENT

Figure 1:
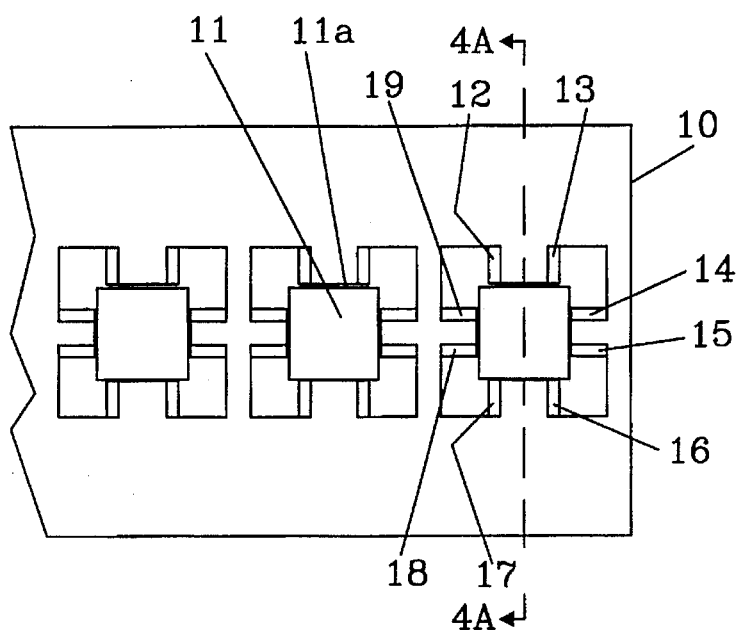
FIG. 1 is a top view of the top guide cover of the alignment assembly of the present invention.

The invention is an integrated circuit package lid alignment tool that minimizes variance of the lid-to-package alignment. A top view of the alignment tool is illustrated in FIG. 1. Cover 10 may have one or more alignment stations. Each station has an opening 11a into which a device package lid 11 is placed. On each side of opening 11a are tapered alignment tabs 12, 13, 14, 15, 16, 17, 18 and 19. Cover 10 may be a single piece of rigid material with tabs 12–19 die cut out of cover 10 and bent to extend downward from the surface of cover 10. Tabs 12–19 align the semiconductor package with the cover as described below.

Figure 2:
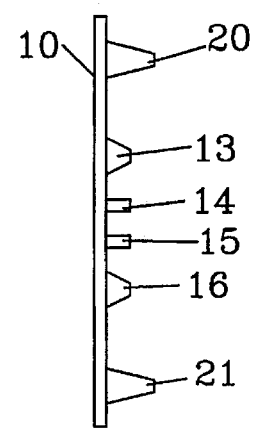
FIG. 2 is an end view of the top guide cover of FIG. 1.

FIG. 2 is an end view of cover 10 showing tapered tabs 13, 14, 15 and 16. Tabs 14 and 15 are shown from an end view. Tabs 13 and 15 are shown from a side view, showing the tapered or beveled sides. Legs 20 and 21 are used in conjunction with boat 40 (FIG. 3) to position lid cover 10 over boat 40, and to align cover 10 over boat 40.

Figure 3:
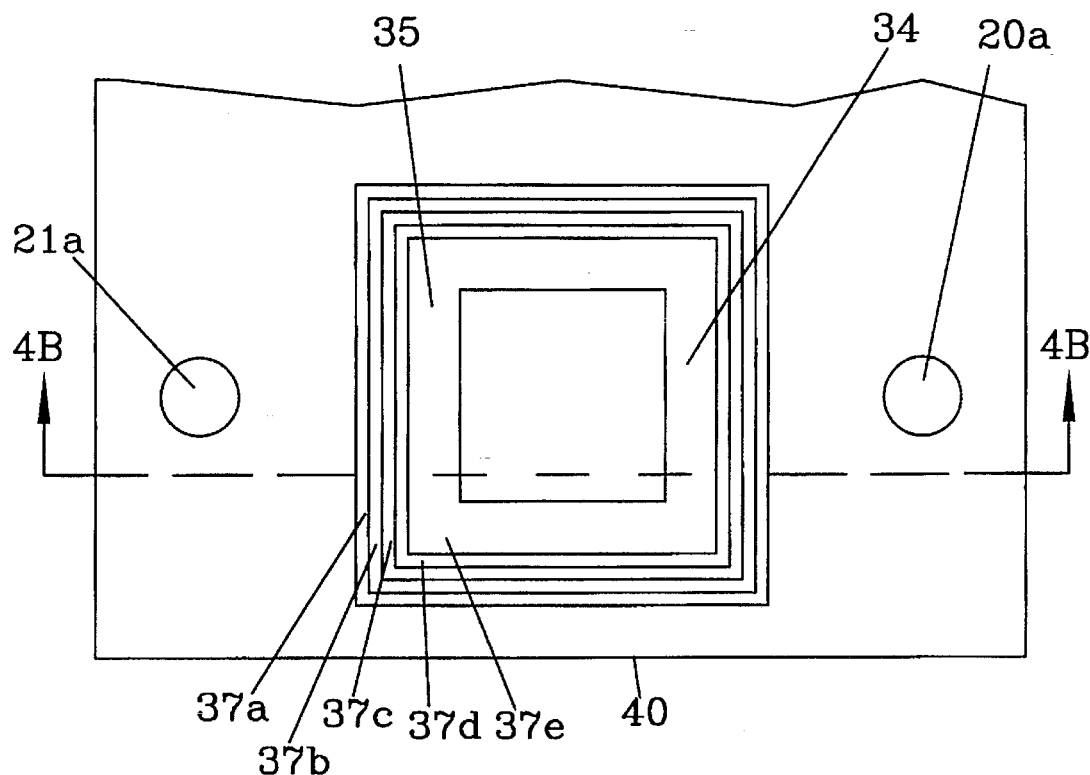
FIG. 3 is a top view of a package carrier/boat.
Figure 4:
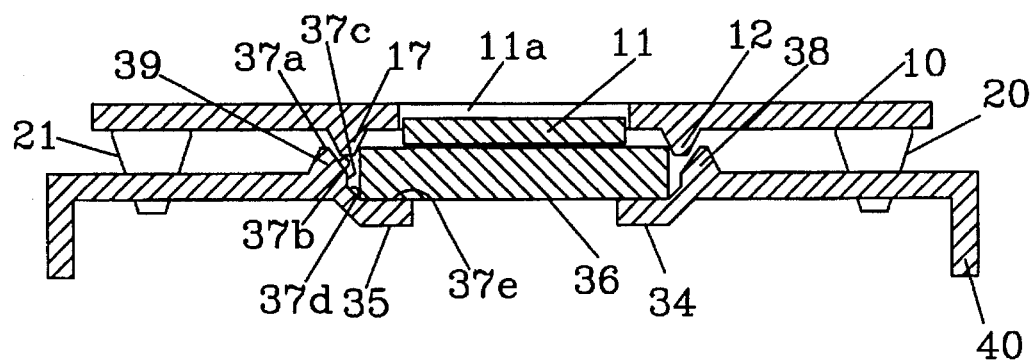
FIG. 4 is a cross-sectional view of the alignment assembly.

FIG. 3 is a top view of the package carrier/boat 40 that is used in conjunction with the cover 10 to align lid 11 to semiconductor package 36 (FIG. 4). A semiconductor package 36 is placed in boat 40 and resides on support surfaces 34 and 35. Openings 20a and 21a receive tapered legs or pins 20 and 21 to align cover 10 over boat 40.

FIG. 4 is a combination cross-sectional view taken through section 4B—4B of FIG. 3, and a cross-section of the cover 10 taken through section A—A of FIG. 1.

Boat 40 has a recessed area which includes bottom supports 34 and 35 on which semiconductor package 36 is placed. The semiconductor package support surfaces 34 and 35 can be provided with a plurality of planar surfaces or facets 37a–e which are dimensioned and configured to cooperate with complementary configured surfaces of the semiconductor package 36 and projecting alignment tabs, such as tabs 12 and 17 depicted in FIG. 4. More particularly, facets 37a and 37b are formed along upwardly-extending flanges 38 and 39 which cooperate with alignment tabs 12 and 17, respectively, to facilitate proper alignment between the tapered surfaces of the cover 10 and the boat 40, as well as any lid 11 and package 36 respectively received therein. With cover 10 in place, tapered tabs 12 and 17 abut against the edges of package 36. The alignment tabs, 12–19 (FIG. 1) will abut against package 36 centering it beneath opening 11a over package 36. Package lid 11, placed in opening 11a, will then also be centered over package 36. Since tabs 12–19 are tapered, variances in package dimensions are taken into consideration, and lid 11 is centered over package 36.

Figure 5:
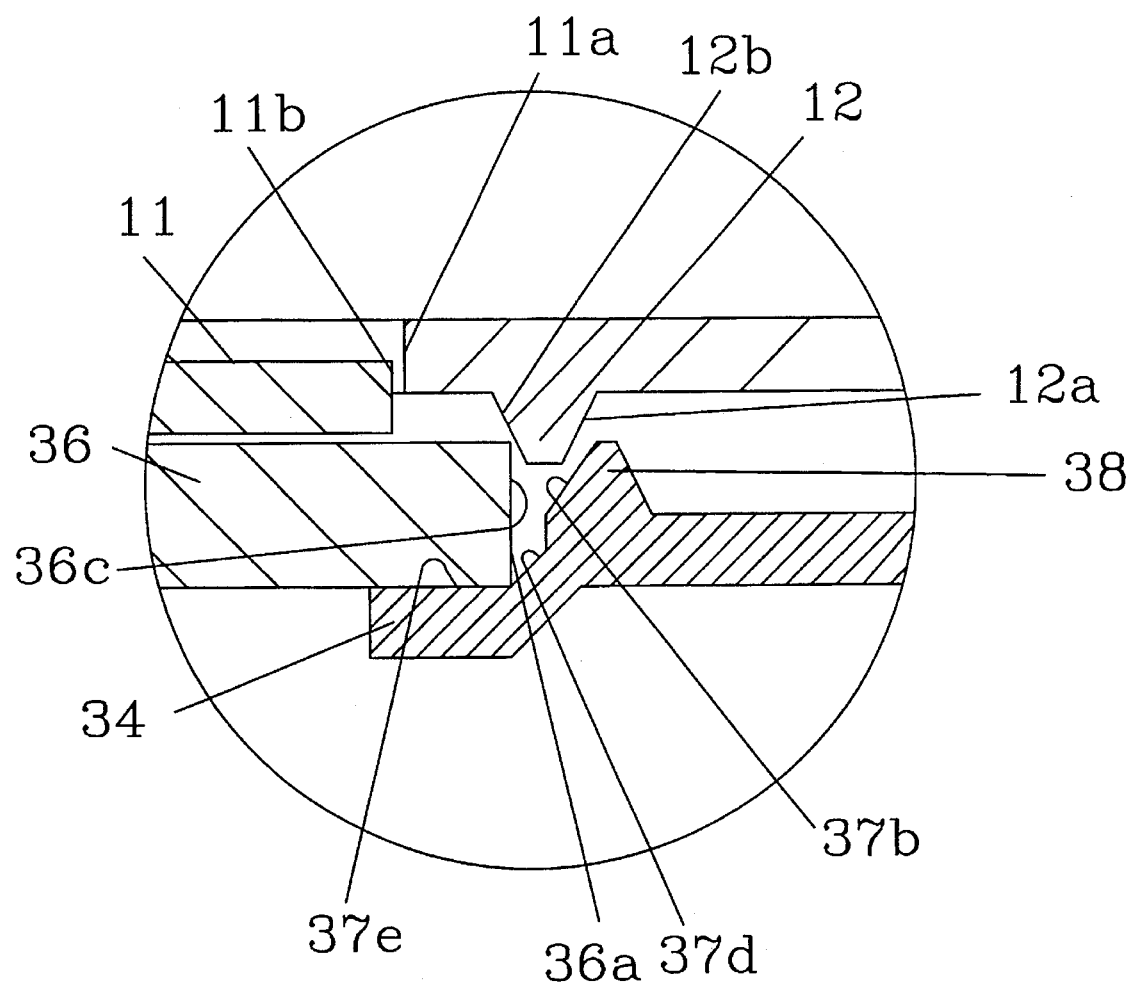
FIG. 5 is an enlarged view of the alignment surfaces.

FIG. 5 is an enlarged view of the right side portion of FIG. 4 illustrating the tapered tabs of cover 30 and semiconductor package 36 and the sliding and centering action between semiconductor package 36 and cover 10. While details of the left side portion are not similarly illustrated in an enlarged view, it is to be understood that cooperation between the tapered surfaces of tab 17 and edges of the semiconductor package 36 are the same as that described below regarding the tab 12 and semiconductor package 36. As cover 10 is lowered, angularly inclined tapered face 12b of tab 12 engages edge 36c of package, whereas angularly inclined tapered face 12a engages angularly inclined facet surface 37b of the boat 40 36. Since cover 10 places two tapered tabs (12 and 17) on each side of package 36 (tabs 12–19) for the quadrilateral package depicted in the drawings, package 36 is centered in relation to cover opening 11a. Opening 11a in cover 10 is simultaneously centered over package 36. When package lid 11 is placed in opening 11a over package 36, then lid 11 is centered over package 36. The tapered shapes of tabs 12-19 compensate for variances in package sizes, while still centering lid 11 over package 36.

Although the present invention and its advantages have been described in connection with the preferred embodiments, it should be understood that various changes, substitutions and alterations can be made herein without departing from the spirit and scope of the invention as defined by the accompanying claims.

What is claimed:

1. An alignment system operable to facilitate the assembly of components having multiple parts, comprising:

a boat having at least one recess that is disposed to receive a first component for assembly, said recess being at least partially defined within said boat by an upstanding leg having a flange surface that is inclined along a plane which extends across at least a portion of said recess; and a cover positionable so as to at least partially overlie said boat, said cover being provided with a least one aperture disposed to receive a second component for assembly, said cover having a leg engageable with said boat leg and including a first surface that is inclined along a plane which is generally parallel to said boat flange surface plane and which extends across at least a portion of said recess, said cover leg including a second surface engageable with the first component for assembly so as to position the cover opening over a prescribed portion of the first component for assembly upon engagement of the respective boat and cover legs.

2. The alignment system according to claim 1, wherein said opening in the alignment cover is rectangular, and there is provided at least one projection on each side of the rectangular opening.

3. The alignment system according to claim 1, wherein said opening in the alignment cover is circular, and there are a plurality of projections equidistantly spaced around the circular opening.

4. The alignment system according to claim 1, wherein at least two of said cover projections engage the first component element to position the first component beneath said cover opening.

5. The alignment system according to claim 1, wherein said first component element is a semiconductor device.

6. The alignment system according to claim 1, wherein said alignment cover and boat projections are operable to engage one another and the first component element received within said boat recess so as to position said first component element in a predetermined orientation within said boat recess.

7. The alignment system according to claim 6, wherein engagement of said alignment cover and boat projections positions said at least one opening over a predetermined portion of the first component element.

8. An alignment system operable to facilitate the assembly of components having multiple parts, comprising:

a boat having at least one recess that is disposed to receive a first component for assembly; and a cover positionable so as to at least partially overlie said boat, one of said boat and said cover having at least one aperture formed therein, the other of said boat and said cover having a leg receivable in said aperture, said cover and said boat further include a plurality of mutually engageable projections operable, upon receipt of said leg in said aperture, to at least partially surround said recess and position the first component for assembly in a specific orientation underlying said cover, said cover further comprising an opening disposed to receive and to position a second component for assembly in a prescribed orientation over the first component for assembly.

9. An alignment system for the assembly of semiconductor device packages, comprising:

A. a boat having:
      (i) a support surface which defines at least one recess configured to receive a semiconductor package;
      (ii) at least one slanted semiconductor package alignment surface that extends from said support surface to direct a semiconductor package into a prescribed position along said support surface; and
      (iii) at least one leg extending from said boat and having a flange surface that is slanted with respect to a principal plane defined by said boat; and B. a cover mountable to said boat and having at least one opening formed therein to receive and to position a semiconductor lid over the semiconductor package received on said boat support surface, said cover including first and second non-parallel slanted surfaces, said first slanted surface being engageable with the semiconductor package and said second slanted surface being engageable with said slanted flange surface to direct the cover into overlying relation with said boat and to position the cover opening in a prescribed overlying relation with respect to the boat.

10. The alignment system according to claim 9, wherein said extension members in contact with said first component element are different from the extension members in contact with said boat.

* * * * *